United States Patent [19]
Torelli et al.

[11] Patent Number: 4,631,485
[45] Date of Patent: Dec. 23, 1986

[54] SYNCHRONOUS DEMODULATOR FOR AMPLITUDE MODULATED SIGNALS

[75] Inventors: Guido Torelli, S. Alessio; Vincenzo Daniele, Milan, both of Italy

[73] Assignee: SGS-ATES Componenti Elettronici S.p.A., Catania, Italy

[21] Appl. No.: 687,739

[22] Filed: Dec. 28, 1984

[30] Foreign Application Priority Data

Dec. 30, 1983 [IT] Italy ............................ 24478 A/83

[51] Int. Cl.⁴ .............................................. H03D 1/06
[52] U.S. Cl. ..................................... 329/50; 329/124; 329/146; 329/178; 455/337
[58] Field of Search ............. 329/50, 101, 122, 124, 329/146, 178; 455/337, 202; 375/77

[56] References Cited
U.S. PATENT DOCUMENTS
4,145,663 3/1979 Yahata et al. .................. 329/178 X
4,253,189 2/1981 Lemoussu et al. ............. 329/122 X Primary Examiner—Siegfried H. Grimm
Attorney, Agent, or Firm—Cushman, Darby & Cushman

[57] ABSTRACT

Two circuits carry out the beating of a modulated signal, with first and second signals, respectively, each having substantially the same frequency as the carrier of the modulated signal but phased-shifted relative to one another by 90°. A commutator controlled by a control circuit alternately selects the signals resulting from the beating. The selection is responsive to the amplitudes of the signals in order to avoid losses of information due to amplitude peaks under a prefixed threshold which may be caused by frequency differences between the signals which are beat.

5 Claims, 9 Drawing Figures

SYNCHRONOUS DEMODULATOR FOR AMPLITUDE MODULATED SIGNALS

The present invention relates to a synchronous demodulator for amplitude modulated signals.

The synchronous demodulation of an amplitude modulated signal is known-per-se and is often used in the prior art. Such demodulation is described for example in the publication by H. Taub and D. Schilling entitled "Principles of Communication Systems", McGrawHill, chapter 3.

The general theory provides that, given an amplitude modulated signal expressed by the formula $$s(t) = A(1 + m \sin \omega_m t)(\sin \omega_c t)$$

where
$\omega_m = 2\pi f_m$
$\omega_c = 2\pi f_c$
$f_m$ = modulating frequency
$f_c$ = carrier frequency
m = modulation index (0 < m < 1)
A = carrier amplitude
synchronous demodulation is effected by beating (that is by multiplying) the modulated signal with a signal (for example sinusoidal) whose frequency $f_b$ is equal to that of the carrier of the modulated signal.

The signal used for the "beat" is given by:

$$s_b = \sin(\omega_c t + \phi_b)$$

where $\phi_b$ is the phase difference between the signal $s_b$ and the carrier of s(t) and where the amplitude of the signal $s_b$ is assumed to be unity.

The output of the multiplier or beat circuit is given by:

$$s_m(t) = \sin(\omega_c t + \phi_b) \cdot A(1 + m \sin \omega_m t)(\sin \omega_c t) = -\tfrac{1}{2} \cdot$$

$$A(1 + m \sin \omega_m t)[\cos(2\omega_c t + \phi_b) - \cos \phi_b]$$

By arranging at the multiplier output a filter which cuts the highest frequencies of $f_m$ (for example, a low-pass filter or a bandpass filter with a central frequency equal to $f_m$), the signal part with a frequency equal to 2$f_c$ is cut and consequently a demodulated signal, whose altered component has the same frequency as the modulating signal, is read out.

The amplitude of the demodulated signal depends, however, on the value of $\cos \phi_b$, that is on the phase difference between the modulated signal and the signal used for the beat. If $\phi_b = 0$ (phase difference equal to zero), the amplitude of the demodulated signal is at a maximum; if, on the other hand, $\phi_b = 90°$ (i.e., the carrier and signal used for the beat are in phase crossing), the demodulated signal has an amplitude of zero. From what has been said, it is desirable, therefore, to have $\phi_b = 0$, that is the signal used for beat should be not only of equal frequency, but also should be in phase with the carrier of the modulated signal.

It happens quite often that the frequency of the carrier of the modulated signal is not exactly equal to that of the signal used for beating or that one of the two is not constant, but instead changes within a certain range. In such case, the frequency $f_c$ of the carrier and the frequency $f_b$ of the signal used for beating differ from each other by a value $\delta f_c$, even though this amount may be slight.

The signal $s_b(t)$ is then:

$$s_b = \sin[(\omega_c + \delta \omega_c)t + \phi_b] = \sin[\omega_c t + (\delta \omega_c t + \phi_b)]$$

where $\delta \omega_c = 2\pi \delta f_c$

The frequency difference causes a time-variable phase difference, however, which in turn results in a kind of modulation of the resultant signal, which, after filtering in a low-pass filter, can be expressed by the formula:

$$s_{d'}(t) = A/2(1 + m \sin \omega_m t)[\cos(\phi_b + \delta \omega_c t)]$$

Mathematically, this corresponds to the superimposition of a signal (not sinusoidal) at variable amplitude and frequency $f_m$ on another signal at frequency $\delta f_c$.

Through a high-pass filter the low frequency component ($\delta f_c$) of the signal $s_{d'}(t)$ can be filtered, thus obtaining an output signal $s_{d''}(t)$ given by:

$$s_{d''}(t) = A/2 \cdot m \sin \omega_m t \cos[(\phi_b + \delta \omega_c t)]$$

Also supposing that beating has occurred in such a way as to have $\phi_b = 0$, such a signal does not produce the desired result, that is a signal exactly corresponding to the original modulating signal, because clearly it has time-variable amplitude peaks instead of constant ones.

This means that the detection of such a signal, more precisely, the demodulation of its information content (for example, the frequency), is extremely difficult and unreliable, because the time periods with amplitude peaks of minimum value could involve loss of detection, and consequently of information, at the detector device. In other words, minimum peaks of too low value can go undetected and consequently, can introduce error in the detector, this causing it to indicate a frequency different from that corresponding to the transmitted information. This obviously results in an erroneous reproduction of the original information.

In view of what has been said, the object of the present invention is to realize a synchronous demodulator for amplitude modulated signals, which allows accurate detection of the information contained in the demodulated signal even in presence of slight frequency differences between the modulated signal carrier and the signal used to beat with the carrier.

According to the invention this object is now obtained by means of a synchronous demodulator comprising a first beat circuit having a first input fed with the modulated signal which is to be demodulated and a second input fed with a signal substantially at the same frequency as the carrier of said modulated signal. The demodulator additionally comprises a second beat circuit having a first input fed with said modulated signal and a second input fed with said signal phase shifted by 90°. A commutator alternately connects the output of said first and second beat circuits to a common output of the demodulator, and control circuit means with an operating threshold controls the commutation of said commutator according to the amplitude of the signals at the outputs of said beat circuits.

In other words, the synchronous demodulator according to the present invention is based on the fact that it operates not just on one but rather two beats arranged in phase crossing so as to create equal signals $s_{d''}(t)$ but having amplitudes out of phase by 90°, the minimum peaks of the first beat coinciding in time with the maximum peaks of the second beat and vice-versa. The commutator, under the control of respective control means (provided with suitable threshold detectors), responds to the maximum peaks of the signals to produce at the output a demodulated signal which is always of sufficient amplitude for the full and correct detection of the information (for example, of frequency) contained in the modulated signal.

With a suitably phase-shifted second beat and the alternating selection of the signal of greater amplitude there is thus compensation for the imperfect correspondence of the output of a single beat circuit with the original modulating signal resulting from a possible inexact frequency equality between the carrier of the modulated signal and the signal used for the beat.

The features of the present invention will be made more evident by the following detailed description of embodiments illustrated by way of non-limitative examples in the accompanying drawings, wherein.

Figure 1:
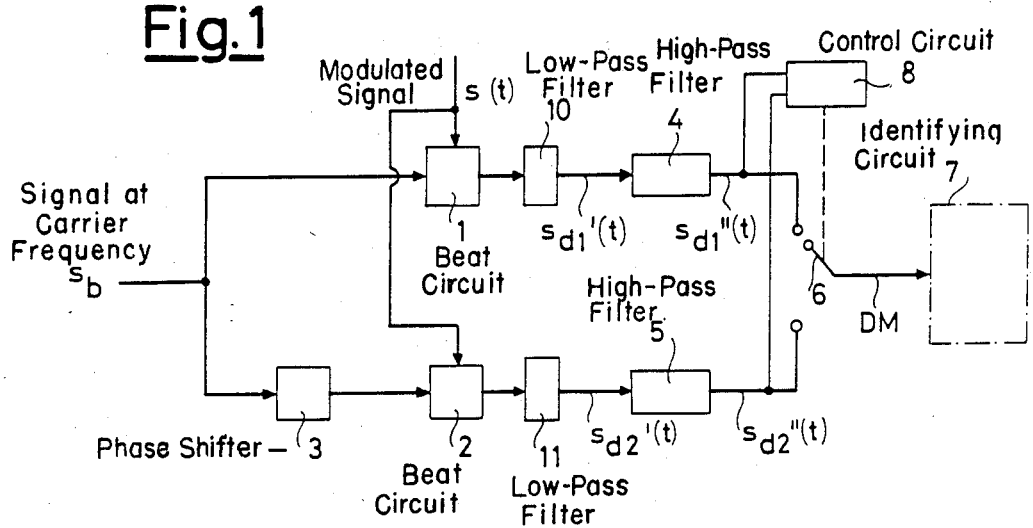
FIG. 1 is a block diagram of a first embodiment of a synchronous demodulator according to the invention.

With reference to FIG. 1, there is illustrated a synchronous demodulator which comprises two beat circuits 1 and 2, the first one of which has a first input fed with an amplitude modulated signal s(t) and a second input fed with a signal $s_b$ having the same frequency as the carrier of the modulated signal, while the second beat circuit has a first input fed with the modulated signal s(t) and a second input fed with the same signal $s_b$ after it has been passed through a phase shifter 3 which introduces a phase shift of 90° to the signal.

The outputs of the beat circuits 1 and 2 which pass respective low-pass filters 10 and 11 and high-pass filters 4 and 5 are directed towards a commutator 6 which alternately connects them to a common output line DM of the demodulator, to which a suitable information detector or identifying circuit 7, for example, a frequency detector, can be connected.

The commutator 6 is controlled by a control circuit 8 responsive to the amplitude of the filtered signals delivered from the beat circuits 1 and 2, said control circuit making use of suitable threshold detectors (not shown) arranged inside or outside the control circuit.

Figure 2:
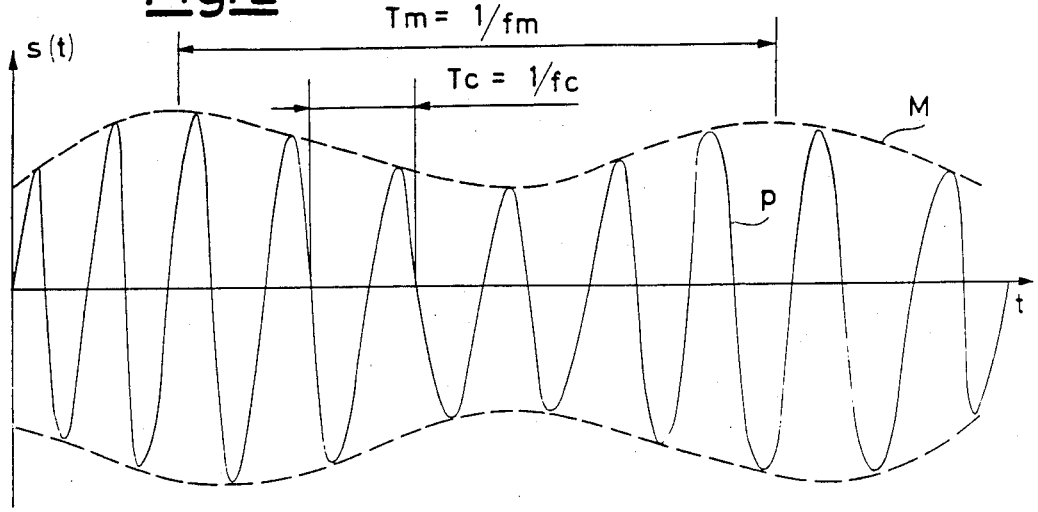
FIGS. 2–8 show the form of the signals in the demodulator illustrated in FIG. 1.

The synchronous demodulator of FIG. 1 operates as follows: The modulated signal s(t), consisting of a carrier P at the frequency $f_c$ and modulated in amplitude by a signal M (for example sinusoidal) at a frequency $f_m$, as shown in FIG. 2, is caused to "beat" in the beat circuit 1 with a signal $s_b$ at substantially the same frequency as the carrier P and in the beat circuit 2 with the same signal $s_b$ phase-shifted 90° by the phase shifter 3.

As a consequence, at the outputs of the beat circuits 1 and 2, after passing the low-pass filters 10 and 11, there exist the following signals with phase-crossing amplitude:

$$s_{d1}'(t)=A/2(1+m \sin \omega_m t)[\cos (\phi_b+\delta\omega_c t)]$$

$$s_{d2}'(t)=A/2(1+m \sin \omega_m t)[\cos (\phi_b+90°+\delta\omega_c t)]$$

Figure 3:
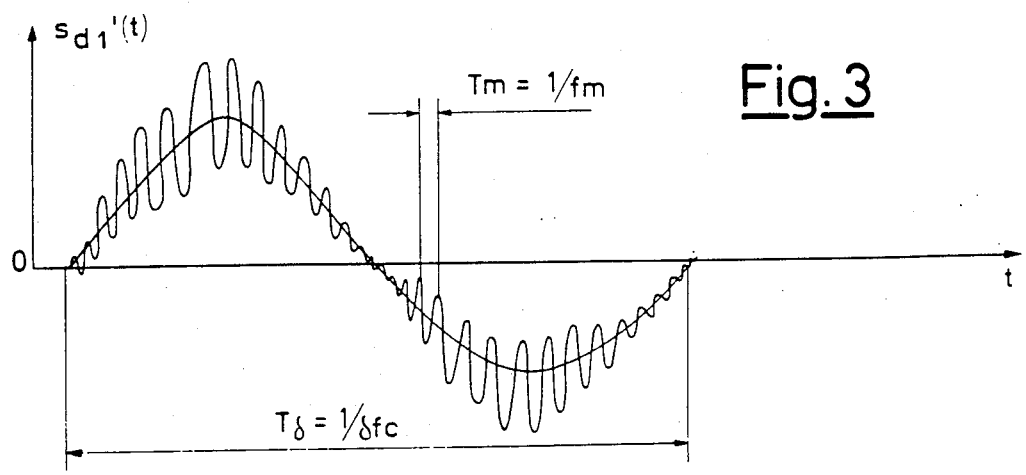
Figure 4:
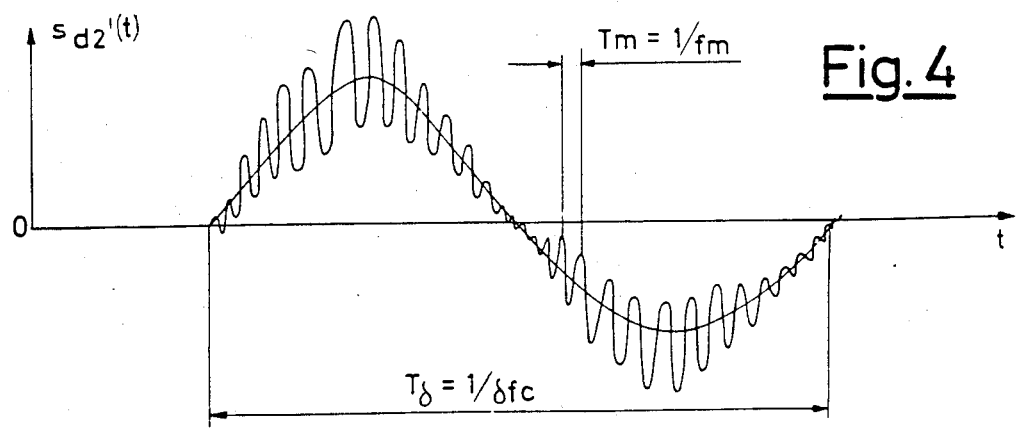

These are illustrated in FIGS. 3 and 4 which show signals in which a component (not sinusoidal) at a frequency $f_m$ is superimposed to another component at a frequency $\delta f_c$, where $\delta f_c$ is the residual error between the carrier P of the modulated signal and the signal $s_b$ used for the beat.

The component at low frequency ($\delta f_c$) of each such signal thereafter, is eliminated by the high-pass filters 4 and 5, at whose outputs there are, respectively the following signals with phase-crossing amplitude:

$$s_{d1}''(t)=A/2 \cdot m \sin \omega_m t [\cos (\phi_b+\delta_c t)]$$

$$s_{d2}''(t)=A/2 \cdot m \sin \omega_m t [\cos (\phi_b+90°+\delta\omega_c t)]$$

Figure 5:
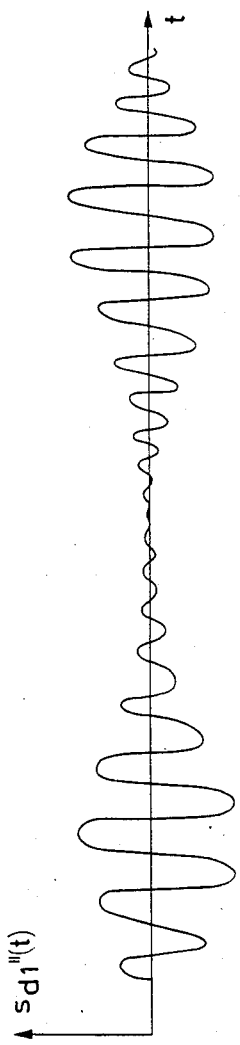
Figure 6:
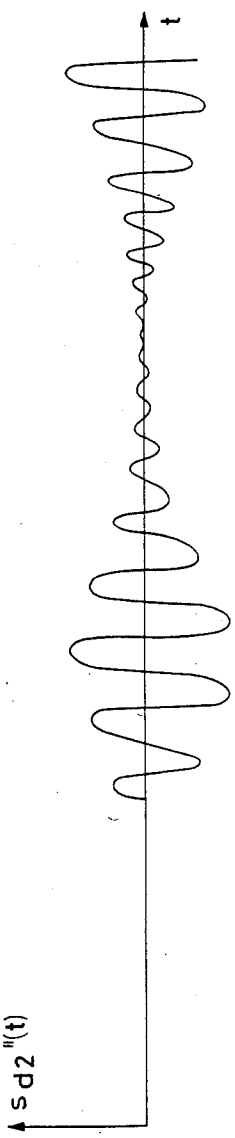

These are illustrated in FIGS. 5 and 6 which show signals having the same frequency $f_m$ as the modulating signal but with amplitude peaks varying between maximum and minimum values.

Figure 7:
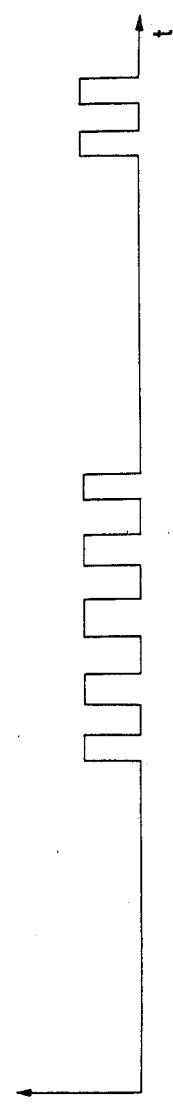

It is evident that every one of said signals, if taken separately, would cause problems for the information detector 7, because it would not "detect" the peaks of minimum height but rather would detect altered information, not corresponding to that transmitted with the modulated signal. More particularly, if the information to be detected is the frequency of the original signal and if the detector 7 were, for example, a digital counter, the information detected would be represented as squared pulse trains spaced by empty spaces, as in FIG. 7, instead of a single square wave at constant frequency $f_m$, corresponding to the transmitted modulating signal.

There is provided, however, the commutator 6, which the control circuit 8 causes to be alternately connected to the two high-pass filters 4 and 5 (and consequently of the beat circuits 1 and 2) according to the instantaneous value of the amplitude peaks of the signals $s_{d1}''(t)$ and $s_{d2}''(t)$. More precisely, the commutator 6 is joined to one of the high-pass filters (the filter 4 in FIG. 1) while the amplitude peaks of the signal $s_{d1}''(t)$ remain above the threshold provided by the control circuit 8, but it immediately switches to the other high-pass filter (the filter 5 in FIG. 1) as soon as the amplitude peaks of this signal fall below the threshold. The same operation then happens in opposite sense relative to signal $s_{d2}''(t)$.

Figure 8:
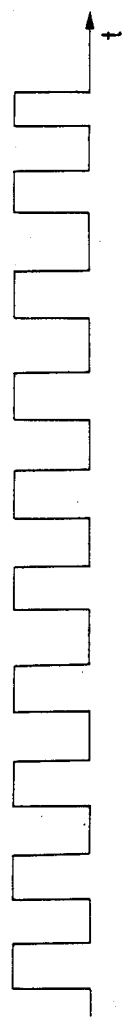

The result is that by taking peaks which alternately are detected, first from one and then from the other one of the two signals $s_{d1}''(t)$ and $s_{d2}''(t)$ in phase crossing, there are no losses of information and there is obtained a demodulated signal DM which exactly corresponds to the modulating signal M and totally represents the information. In the embodiment which has been described, the demodulated signal allows a digital counter to reproduce detected information in the shape of a square wave of constant frequency $f_m$ as represented in FIG. 8.

Figure 9:
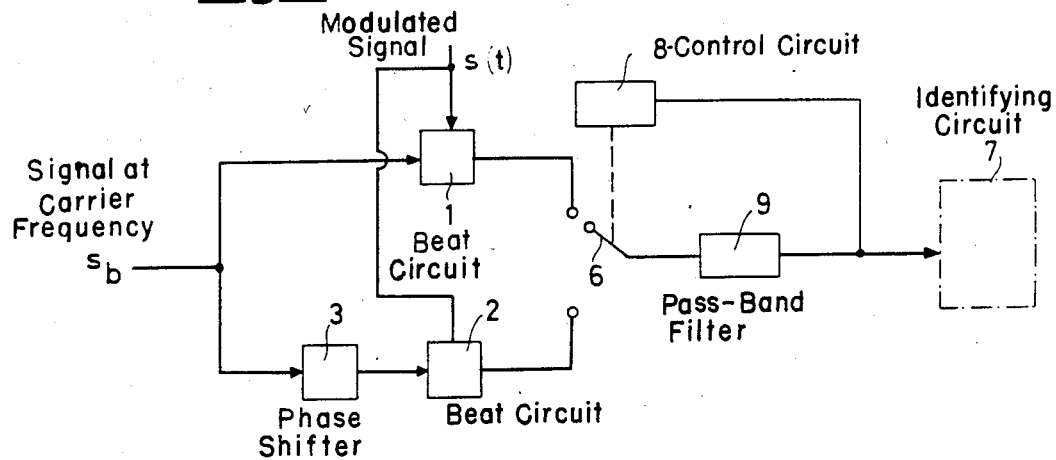
FIG. 9 is a block diagram of another embodiment of a synchronous demodulator according to the invention.

The embodiment of the demodulator which is illustrated in FIG. 9 is functionally the same as that just described. It differs from that of FIG. 1 only in that it has a single pass-band filter 9 situated at the common output of the demodulator instead of two pairs of filters 10, 11 and 4, 5 situated at the outputs of the two beat circuits 1 and 2, as in FIG. 1. In the FIG. 9 embodiment, the control circuit 8 is able to "detect" the demodulated signal at the common output of the demodulator rather than responding to the two signals at the outputs of the filters 4 and 5.

The demodulator of FIG. 9 has the advantage of saving a filter. On the other hand a certain waiting time is necessary before the demodulator reaches the normal running.

Other possible solutions, including combinations of what is illustrated in FIGS. 1 and 9, may occur to those skilled in art, the concepts of the invention, as previously described, remaining unaltered.

We claim:

1. A synchronous demodulator for amplitude modulated carrier signals, comprising a first beat circuit having a first input fed with the modulated signal and a second input fed with a beat signal substantially at the same frequency as the carrier of said modulated signal; a second beat circuit having a first input fed with said modulated signal and a second input fed with said beat signal phase-shifted by 90°; a commutator for alternately connecting the output signals of said first and second beat circuits to a common output of the demodulator; and control circuit means with an operation threshold for controlling switching of said commutator according to the amplitudes of the outputs signals of said beat circuits.

2. A synchronous demodulator according to claim 1, further comprising filters arranged at the outputs of said beat circuits for eliminating low and high frequency components of the respective output signals.

3. A synchronous demodulator according to claim 1, further comprising at least one filter joined to said common output of the demodulator so as to eliminate low and high frequency components of the respective output signals.

4. A synchronous demodulator according to claim 1 wherein said control circuit is arranged to detect the output signals of said beat circuits.

5. A synchronous demodulator according to claim 1 wherein said control circuit is disposed downstream of said commutator so as to detect signals at said common output of the demodulator.

* * * * *